United States Patent [19]

Lin

[11] Patent Number: 5,801,551
[45] Date of Patent: Sep. 1, 1998

[54] DEPLETION MODE PASS GATES WITH CONTROLLING DECODER AND NEGATIVE POWER SUPPLY FOR A PROGRAMMABLE LOGIC DEVICE

[75] Inventor: Jonathan Lin, Milpitas, Calif.

[73] Assignee: Advanced Micro Devices, Inc., Sunnyvale, Calif.

[21] Appl. No.: 690,768

[22] Filed: Aug. 1, 1996

[51] Int. Cl.$^6$ .................. H03K 19/082; H03K 19/20
[52] U.S. Cl. .................. 326/113; 326/107; 326/120; 326/88
[58] Field of Search .................. 326/88, 105, 108, 326/83, 112, 113, 107, 120

[56] References Cited

U.S. PATENT DOCUMENTS

| | | | |
|---|---|---|---|
| 4,818,900 | 4/1989 | Klass et al. | 326/120 |
| 4,835,418 | 5/1989 | Hsieh | 326/57 |
| 5,130,704 | 7/1992 | Ogawa et al. | 326/105 |
| 5,418,480 | 5/1995 | Hastie et al. | 326/113 |
| 5,488,316 | 1/1996 | Freeman et al. | 326/103 |

FOREIGN PATENT DOCUMENTS

| | | | |
|---|---|---|---|
| 58-56530 | 4/1983 | Japan | 326/120 |
| 59-16425 | 1/1984 | Japan | 326/120 |

OTHER PUBLICATIONS

Balasubramanian et al., "Two-Bit Partitioning Driver", IBM Technical Disclosure Bulletin, vol. 18, No. 9, pp. 2958–2959, Feb. 1976.

Cukier, "Noninverting Logic Using Depletion Load", IBM Technical Disclosure Bulletin, vol. 18, No. 10, p. 3325, Mar. 1976.

Knepper, "FET Enhancement/Depletion Logic Circuit", IBM Technical Disclosure Bulletin, vol. 20, No. 4, pp. 1422–1423, Sep. 1977.

Primary Examiner—Edward P. Westin
Assistant Examiner—Richard Roseen
Attorney, Agent, or Firm—Fliesler, Dubb, Meyer & Lovejoy

[57] ABSTRACT

Depletion mode pass gates utilized in a PLD to enable a gate voltage of Vcc to be applied for turn off, as opposed to a higher voltage required for enhancement type devices. With Vcc applied for turn off, gate oxide stress is reduced and chip reliability increased. A decoder utilizing PMOS transistors is further used to supply a negative gate voltage to enable turn off of the depletion mode pass gates. In one embodiment, to prevent pumping the power supply voltage above Vcc when supplying Vcc to gates of the pass gates, the decoder is an all PMOS device using PMOS transistors to connect Vcc to gates of the pass gates. In another embodiment both NMOS and PMOS transistors are utilized, with PMOS blocking transistors utilized to prevent a negative voltage from being applied to the NMOS transistors and causing current leakage. A negative voltage pump is further provided to supply a sufficient negative voltage.

10 Claims, 5 Drawing Sheets

DEPLETION MODE PASS GATES WITH CONTROLLING DECODER AND NEGATIVE POWER SUPPLY FOR A PROGRAMMABLE LOGIC DEVICE

BACKGROUND OF THE INVENTION

1. Field of the Invention

The present invention relates to pass gate transistors utilized in a programmable logic device (PLD). Further, the present invention relates to decoders for controlling the pass gates, and a power supply for providing power to the decoders which control the pass gates.

2. Description of the Related Art

Interconnected pass gates previously used in PLDs were enhancement mode devices, or devices requiring a positive gate to source voltage for turn on. Such pass gates are typically NMOS transistors having a gate to source threshold voltage (Vtn) of approximately 0.7 V. Interconnected enhancement mode pass gates are typically utilized to form a switch matrix in a programmable array logic (PAL) device, to form a switch matrix in a field programmable gate array (FPGA), or to form programmable interconnect points (PIPs) in an FPGA.

FIG. 1 shows a conventional arrangement of interconnected enhancement mode NMOS pass gates 101–104 in a PLD. The pass gates 101–104 have source to drain paths interconnected to form an output. The pass gates 101–104 are controlled by signals provided from a decoder 120 composed of NMOS transistors which decode signals from memory cells, or fuses, 110 and 111.

In operation, a high signal is provided to the gate of one of the pass gates 101–104 to turn it on, while a low signal is applied to the remaining pass gates. Indications of the state of the memory cells 110 and 111 needed to turn on a cell are provided above its gate (i.e. 00, 01, . . . ), the least significant bit (LSB) corresponding to the state of the A output of memory cell 111 and the most significant bit (MSB) corresponding to the state of the B output of memory cell 110.

Ground is applied as the low voltage to the gates of the pass gates 101–104 which are to be turned off. Because each of the pass gates 101–104 is an enhancement mode NMOS transistor having a positive threshold Vtn, with a source to drain voltage of Vcc applied to one of the pass gates 101–104, Vcc+Vtn must be applied to its gate as the high voltage to turn it on.

Because the memory cell 110 must apply voltages to the gates of pass gates 101–104 through the source to drain path of an additional NMOS transistor in decoder 120, to provide Vcc+Vtn to the gate of one of pass gates 101–104, the memory cell 110 must provide a voltage of Vcc+2Vtn. For an NMOS transistor in the decoder 120 to pass the voltage Vcc+2Vtn, Vcc+2Vtn must be applied to its gate using memory cell 111.

With a voltage of Vcc+2Vtn applied to a gate of an NMOS transistor in decoder 120, gate oxide in the transistor will be unduly stressed, reducing the life of the transistor, and, thus, decreasing reliability of a chip containing the pass gates. The thickness of the gate oxide of NMOS transistors receiving a voltage Vcc+2Vtn can be increased to reduce oxide stress and improve reliability, but increasing gate oxide thickness adds manufacturing steps and increases overall cost of the chip.

Similarly, with a voltage of Vcc+Vtn applied to gates of pass gate transistors 101–104, gate oxide in these transistors will be unduly stressed, reducing overall chip reliability.

SUMMARY OF THE INVENTION

The present invention enables Vcc, rather than Vcc+Vtn, to be provided to the gate of a pass gate to turn it on, thus enabling gate oxide stress to be reduced and chip reliability improved.

With Vcc, rather than Vcc+Vtn used to turn on a pass gate, the present invention further enables increased operation speed for the pass gates.

The present invention includes depletion mode pass gate transistors which have a 0.0 V or lower threshold in contrast to enhancement mode devices. With Vcc applied to the source to drain path of a depletion mode pass gate, Vcc applied to the gate of the pass gate will turn it on, rather than a greater value such as Vcc+Vtn.

To supply a negative gate voltage to enable turn off of the depletion mode pass gates, the present invention further includes a decoder utilizing PMOS transistors to pass the negative voltage. In one embodiment, to prevent pumping the power supply voltage above Vcc when supplying Vcc to gates of the pass gates, the decoder of the present invention is an all PMOS device and uses PMOS transistors to connect the voltage Vcc to gates of the pass gates. In another embodiment, both NMOS and PMOS transistors are utilized in the decoder. To prevent a negative voltage from being applied to the source to drain path of NMOS transistors in the decoder, a condition causing significant current leakage, a PMOS blocking transistor is utilized to connect the NMOS transistors to the pass gates where the negative voltage is applied.

To supply the negative voltage to the decoder, the present invention includes a negative voltage pump. The negative voltage pump includes a capacitor having a first terminal receiving a clock signal transitioning between ground and Vcc, a first PMOS transistor having a source to drain path connecting the second terminal of the capacitor to an output supplying the negative voltage, and a gate connected to the second terminal of the capacitor, and a second PMOS transistor having a gate connected to the output and having a source to drain path connecting the second terminal of the capacitor to ground.

As configured, the negative voltage supplied at the output of the negative voltage pump will be approximately −Vcc/2. The voltage −Vcc/2 provided to a decoder enables a negative voltage to be applied at the gate of a pass gate even with a threshold voltage increase (Vtp) through one or more PMOS transistors utilized in the decoder.

BRIEF DESCRIPTION OF THE DRAWINGS

Further details of the present invention are explained with the help of the attached drawings in which.

DETAILED DESCRIPTION

Figure 1:
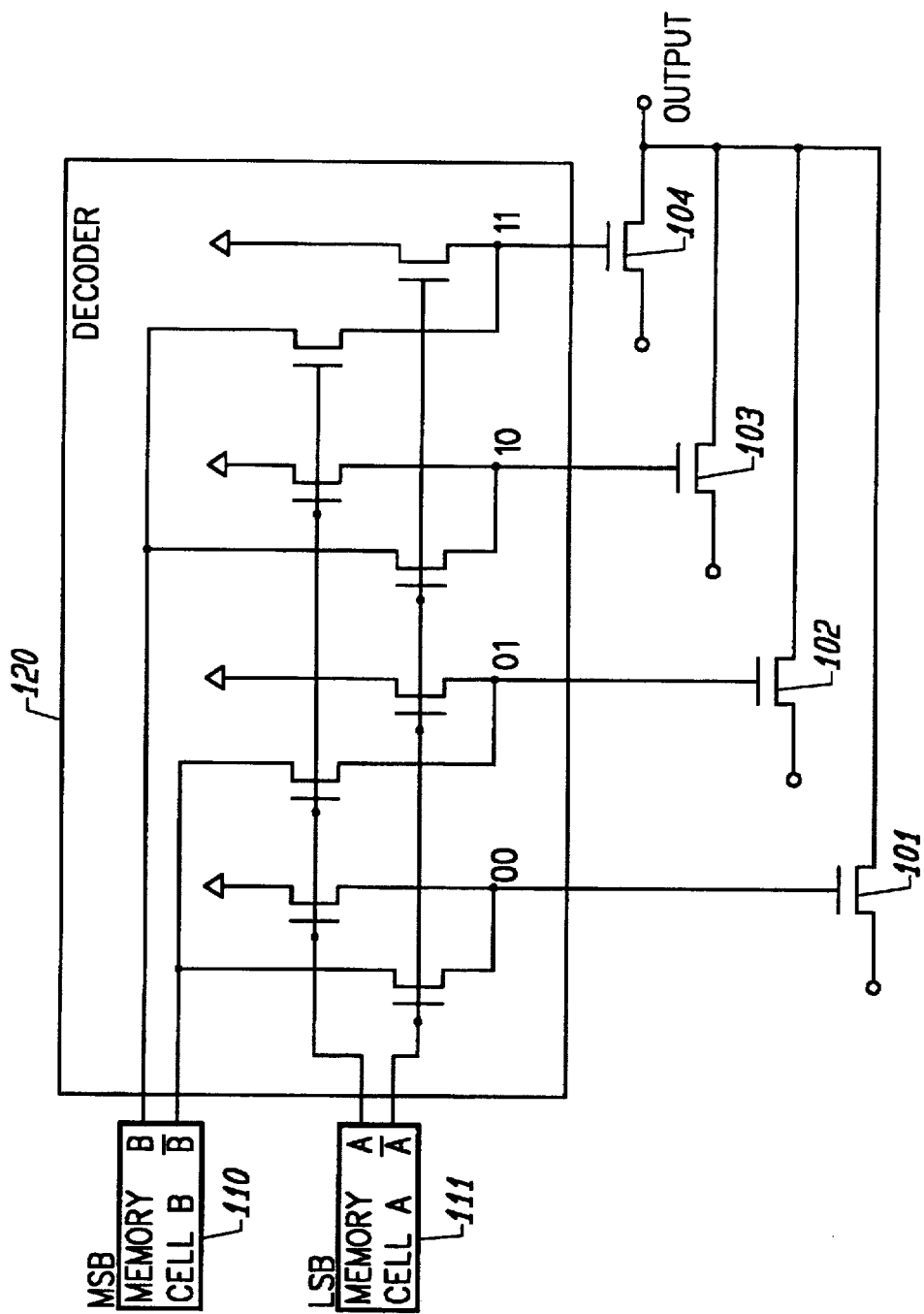
FIG. 1 shows a conventional arrangement of enhancement mode NMOS pass gates, along with a decoder and memory cells for controlling the pass gates.
Figure 2:
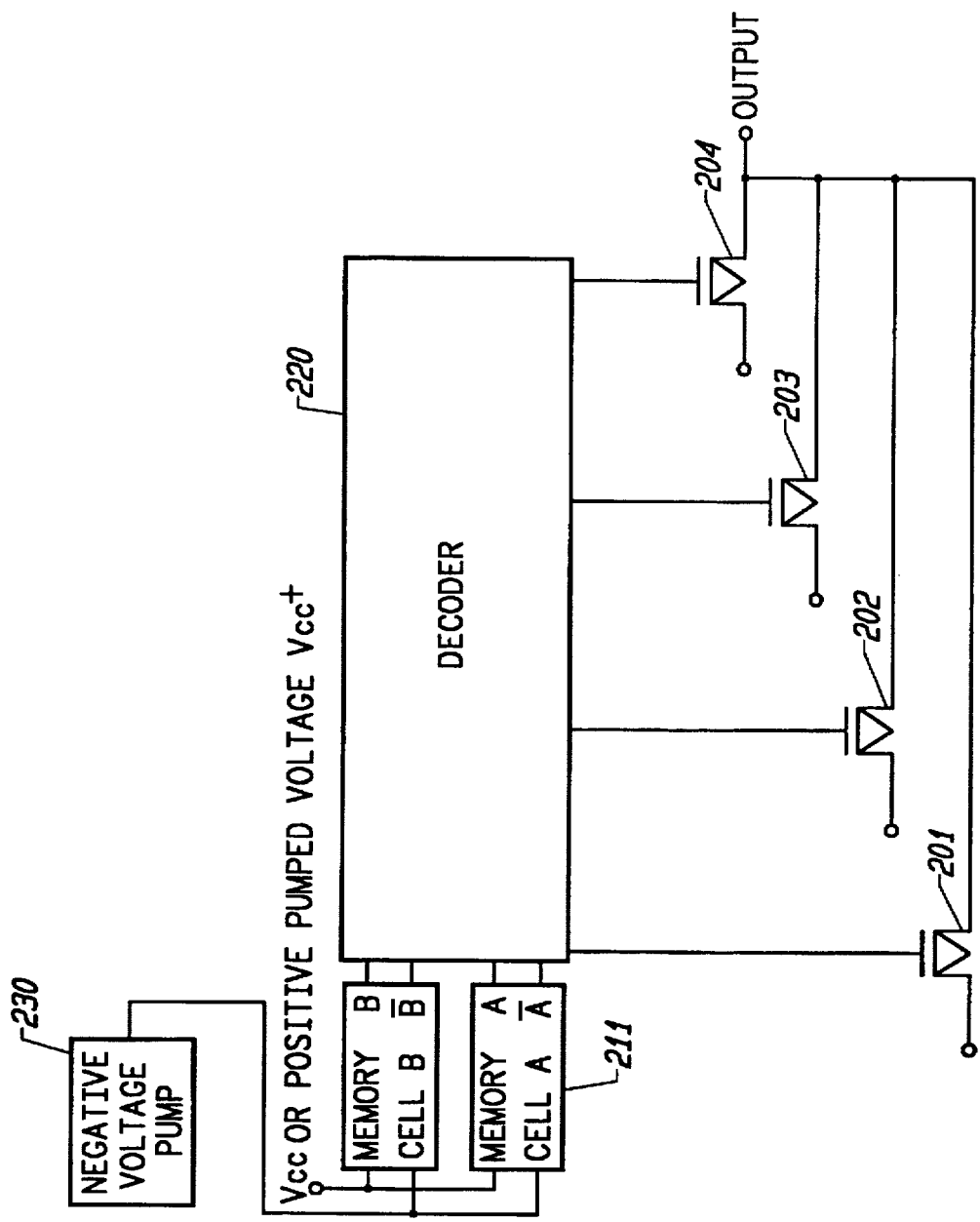
FIG. 2 shows depletion mode pass gates of the present invention along with a decoder, memory cells and a negative voltage pump for controlling the pass gates.

FIG. 2 shows interconnected pass gates 201–204 of the present invention, the pass gates 210–204 being depletion mode devices having a threshold of 0.0 V of less. Also shown in block diagram in FIG. 2 are a decoder 220, memory cells 210 and 211 and a negative voltage pump 230 connected for controlling the pass gates.

The depletion mode pass gate transistors 201–204 are created by utilizing additional ion implantation in the channel between the source and drain of the pass gates during manufacture to reduce the threshold to 0.0 V or less. The fact that pass gates 201–204 are depletion mode devices is indicated by triangles placed between the source and drain of the transistor symbols.

Because each of the pass gates 201–204 have a threshold of 0.0 V or less, with a source to drain voltage of Vcc applied to one of the pass gates, a similar high state voltage of Vcc, rather than Vcc+Vtn, can be applied to its gate to turn it on. Either Vcc, or a voltage pumped greater than Vcc, (Vcc+), is applied to the memory cells 210 and 211 to enable Vcc to be applied to the gates of transistors 201–204, for reasons described in detail below.

With Vcc, as opposed to Vcc+Vtn, applied to gates of pass gates 201–204 as a high state for turn on, gate oxide receives less stress increasing transistor life and overall chip reliability. Further, with a threshold of 0.0 V or lower, the depletion mode pass gates 201–204 can be turned on faster than enhancement mode devices 101–104, increasing operation speed.

Because each of the pass gates 201–204 are depletion mode devices, a negative gate voltage is required to be applied for a low state. To provide the negative voltage, a negative voltage pump 230 is connected to memory cells 210 and 211. The circuitry for the negative voltage pump is described in detail below.

Figure 3:
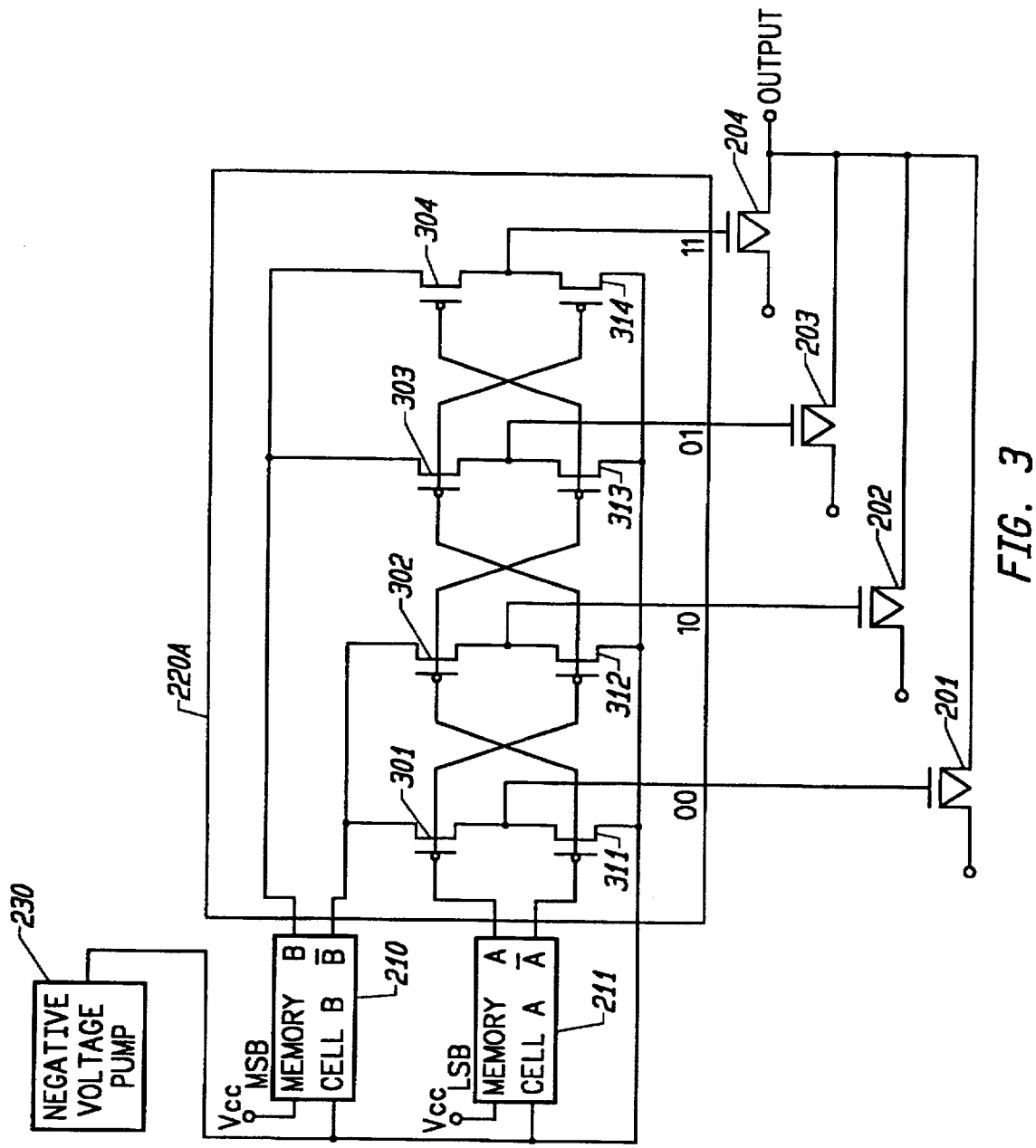
FIG. 3 shows an embodiment of circuitry which may be utilized in the decoder of FIG. 2.

FIG. 3 shows a circuit embodiment 220A which may be utilized in the decoder 220 of FIG. 2. In the decoder 220A of FIG. 3 PMOS transistors are utilized, as opposed to NMOS transistors used in the decoder 120 of FIG. 2. The PMOS type transistors are indicated in FIG. 3 with circles on their gates. For convenience, additional components which are carried over from FIG. 2 to FIG. 3 are similarly labeled.

Decoder 220A first includes PMOS transistors 301–304. A first pair of the PMOS transistors 303 and 304 have sources connected to a first output (B) of memory cell 110 and gates connected to receive a respective one of a first output (A) of memory cell 111 and its inverse ($\overline{A}$). A second pair of the PMOS pull up transistors 301 and 302 have sources connected to receive the inverse ($\overline{B}$) of the first output of memory cell 210 and gates connected to receive a respective one of a first output (A) of memory cell 211 and its inverse ($\overline{A}$). Drains of transistors 301–304 are each connected to the gate of a respective one of the depletion mode pass gates 201–204.

Decoder 220A further includes PMOS pull down transistors 311–314, each having a source to drain path connecting a negative voltage from the negative voltage pump 230 to the drain of a respective one of the PMOS transistors 301–304. Gates of each of the PMOS pull down transistors 311–314 are connected to the memory cell 211 to receive a different one of the signal (A) and its inverse ($\overline{A}$) than the respective one of the PMOS transistors 301–304 to which it is connected.

Memory cells 210 and 211 serve as switches to selectively provide either Vcc or a negative voltage from negative voltage pump 230 at their outputs (A) ($\overline{A}$), (B) and ($\overline{B}$).

In operation, decoder 220A provides a high signal to the gate of a selected one of the PMOS transistors 201–204 to turn it on, while a low signal is applied to the remaining PMOS pass gates 201–204. Indications of the state of the memory cells 210 and 211 needed to turn on one of pass gates 201–204 are provided above its gate (ie. 00, 01, ... ), the least significant bit (LSB) corresponding to the state of the A output of memory cell 211 and the most significant bit (MSB) corresponding to the state of the B output of memory cell 210.

With pass gates 201–204 being depletion mode devices, decoder 220A provides a negative voltage as the low voltage to the gates of the pass gates 201–204 which are to be turned off. The negative voltage must be passed through one of the PMOS transistors in the decoder 220A to the gates of pass gates 201–204, resulting in a PMOS threshold increase (Vtp). The negative voltage from the negative voltage pump 230 must, therefore, have a magnitude greater than Vtp.

With transistors 301–304 being PMOS devices which do not cause a threshold drop when passing a positive voltage, Vcc can be applied to the source and gate of one of the PMOS transistors 301–304 to pass Vcc as the high voltage to the gate of the selected one of pass gates 201–204. With pass gates 201–204 being depletion mode devices, the gate voltage of Vcc will turn it on to pass an equal voltage of Vcc from its source to drain, unlike with enhancement mode devices which require a gate voltage of Vcc+Vtn. With a maximum voltage of Vcc applied to gates of transistors, gate oxide in transistors will be less stressed, and switching speed will be increased as opposed to devices utilizing voltages above Vcc.

Figure 4:
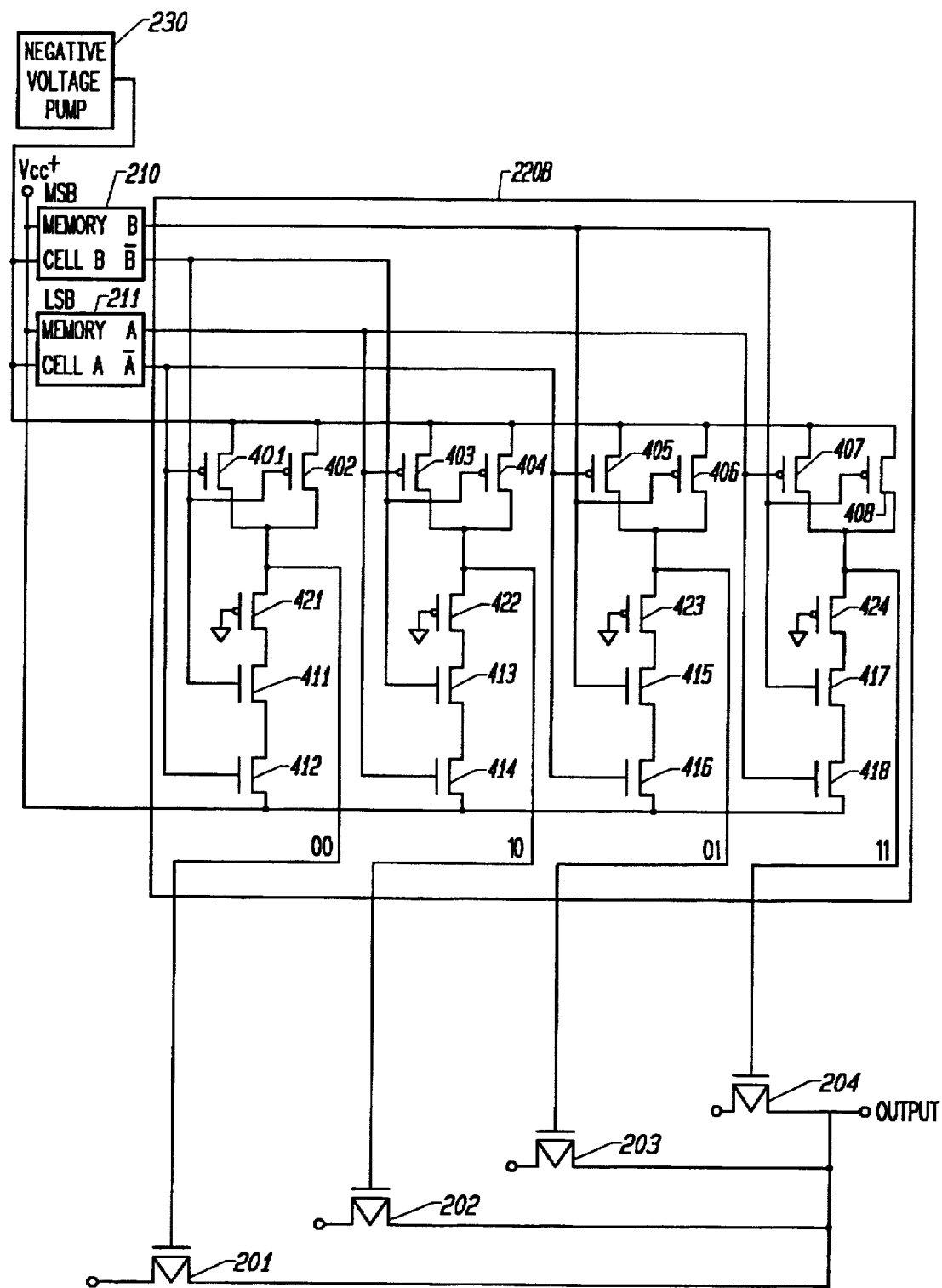
FIG. 4 shows an alternative embodiment of circuitry for the decoder of FIG. 2.

FIG. 4 shows alternative circuitry 220B for the decoder 220 of FIG. 2. The decoder 220B of FIG. 4 includes both NMOS and PMOS transistors. For convenience, additional components which are carried over from FIG. 2 to FIG. 4 are similarly labeled.

Decoder 220B first includes four pairs of PMOS transistors 401–402, 403–404, 405–406, and 407–408. Each PMOS transistor pair have source to drain paths connected in parallel to connect a negative voltage from the negative voltage pump 230 to the gate of a respective one of the pass gates 201–204. Each pair of the PMOS transistors further include a first transistor with a gate connected to receive the output (A) of memory cell 211 or its inverse ($\overline{A}$), and a second transistor with a gate connected to receive the output (B) of memory cell 210 or its inverse ($\overline{B}$), wherein each pair of the PMOS transistors receive a different respective combination of the output (A) and its inverse ($\overline{A}$) and the output (B) and its inverse ($\overline{B}$).

Decoder 220B further includes four pairs of NMOS transistors 411–412, 413–414, 415–416, and 417–418. Each pair of NMOS transistors have source to drain paths connected in series to couple a positive voltage Vcc+Vtn to the gate of a particular one of the pass gates 201–204. Each pair of NMOS transistors further have gates connected to receive the same one of the outputs (A), ($\overline{A}$), (B) and ($\overline{B}$) as the PMOS transistor pair which is also coupled to the particular pass gate transistor.

Figure 5:
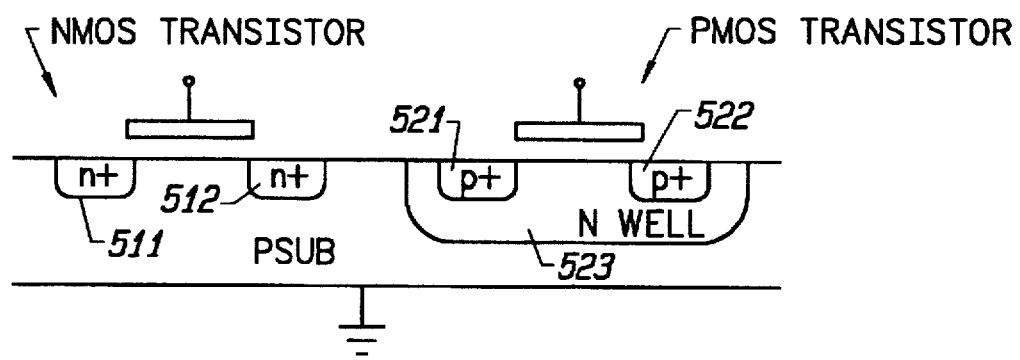
FIG. 5 shows a cross section of an NMOS transistor and a PMOS transistor provided in a substrate.

As shown in FIG. 5, an NMOS transistor, such as NMOS transistors 411–418 of FIG. 4, includes n+ type source and drain implant regions 511 and 512 in a p type substrate which is connected to ground. With a negative voltage applied to one of the n+ implant regions, a forward biased n-p diode is created, causing a leakage current. Alternatively as shown in FIG. 5, a PMOS transistor includes p+ type source and drain implant regions 521 and 522 provided in a large n well 523, the n well isolating the p+ type implant regions from the p+ type substrate. Thus, with the PMOS transistor, when a negative voltage is applied to one of the p+ type implant regions, no forward biased diode is created to cause leakage current. Thus, PMOS transistors 401–408 are utilized in the circuit of FIG. 4 to pass negative voltage.

However, with a negative voltage applied through one of the PMOS transistors 401–408 to the gates of pass gates 201–204, a negative voltage might be applied to the drain of one of NMOS transistors 411, 413, 415 or 417. To prevent leakage current, additional PMOS transistors 421–424 are provided in decoder 220B of FIG. 4, each with a source to drain path connecting one of the pass gates 201–204 to the drain of a respective one of transistors 411, 413, 415 and 417, and its gate grounded. The PMOS transistors 421–424, thus, serve to prevent any current flow to the drains of transistors 411, 413, 415 and 417 when a negative voltage is applied to one of transistors 201–204.

Further in FIG. 4, memory cells 210 and 211 serve as switches to selectively provide either a negative voltage from negative voltage pump 230, or a voltage pumped above Vcc, (Vcc+) at their outputs.

In operation with decoder 220B of FIG. 4, a high signal is provided to the gate of a selected one of the PMOS transistors 201–204 to turn it on, while a low signal is applied to the remaining PMOS pass gates 201–204. Indications of the state of the memory cells 210 and 211 needed to turn on one of pass gates 201–204 are provided above its gate (ie. 00, 01, ... ), the least significant bit (LSB) corresponding to the state of the A output of memory cell 211 and the most significant bit (MSB) corresponding to the state of the B output of memory cell 210.

With pass gates 201–204 being depletion mode devices, a negative voltage is applied as the low voltage to the gates of the pass gates 201–204 which are to be turned off. The negative voltage must be passed through one of the PMOS transistors 401–408 in the decoder 220B to the gates of pass gates 201–204, resulting in a PMOS threshold increase (Vtp). The negative voltage from the negative voltage pump 230 must, therefore, have a magnitude greater than Vtp.

With transistors 411–418 being NMOS devices which each cause an NMOS threshold drop, Vcc+2Vtn or greater must be applied as the voltage (Vcc+) to the NMOS transistors to enable Vcc to be applied as a high signal to the gates of the pass transistors 201–204.

Figure 6:
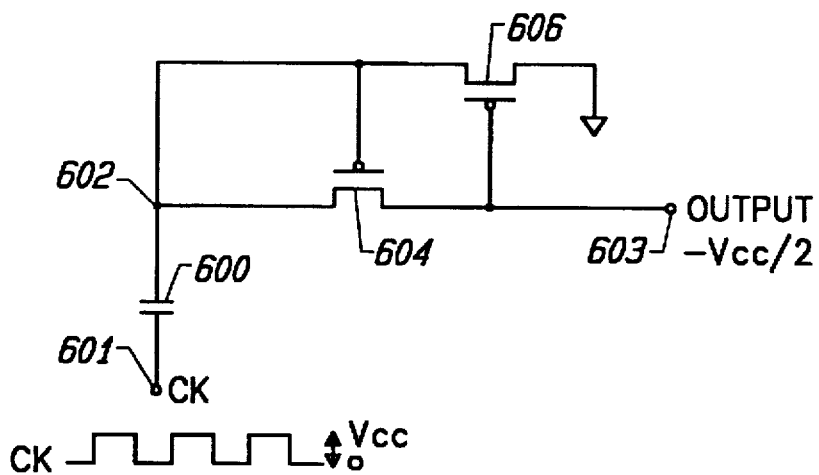
FIG. 6 shows circuitry for the negative voltage pump of FIG. 2.

FIG. 6 shows circuitry for the negative voltage pump 230 which can provide a negative voltage having a magnitude greater than Vtp as needed for the decoder circuits of FIGS. 3 and 4. The negative voltage pump includes a capacitor 600 connecting a clock node 601 providing a clock signal which transitions between ground and Vcc to a node 602. The voltage pump further includes a PMOS transistor 604 having a source to drain path connecting node 602 to an output node 603 which supplies the negative voltage, and a gate connected to node 602. Further, the negative voltage pump includes a second PMOS transistor 606 having a gate connected to the output node 603 and a source to drain path connecting node 602 to ground.

In operation, we first assume node 602 is at ground when the clock signal goes to Vcc. Transistor 604 will then be off, but a rising voltage on node 601 will be greater than the voltage at node 603 maintaining transistor 606 in an on state. Transistor 606 will, thus, withdraw charge from node 602 to hold node 602 at ground. When the clock signal switches to ground, transistor 606 will still be on and withdrawing charge from node 602 to pull node 602 toward −Vcc. When node 602 drops below node 602, transistor 604 will turn on, to pull down node 603. With a voltage increase due to the PMOS threshold Vtp in transistor 604, transistor 606 will remain on. When the clock returns to Vcc, node 602 will be pulled above node 603 to turn off transistor 604, but transistor 606 will remain on to continue pulling node 602 toward ground. Over time with the clock transitioning between Vcc and ground, the negative voltage supplied at the output 603 will be approximately −Vcc/2. The voltage −Vcc/2 provided to a decoder will have a magnitude greater than a PMOS threshold Vtp as required.

Although the invention has been described above with particularity, this was merely to teach one of ordinary skill in the art how to make and use the invention. Many modifications will fall within the scope of the invention, as that scope is defined by the claims which follow.

What is claimed is:

1. An apparatus comprising a multiplexer comprising:
    depletion mode pass gate transistors having source to drain paths connected together on a first end to form a data output of the multiplexer, wherein a second end of the source to drain path of each of the depletion mode pass gates forms a data input of the multiplexer; and
    a decoder having outputs connected to gates of the depletion mode pass gates and having inputs forming select inputs of the multiplexer.

2. The apparatus of claim 1 wherein the decoder is configured to provide a negative voltage to gates of the depletion mode pass gate transistors which are to be turned off.

3. The apparatus of claim 2, wherein the decoder comprises:
    PMOS transistors, each PMOS transistor having a drain connected to the gate of one of the pass gates, wherein the PMOS transistors are connected so that when it is desired to turn off a respective one of the pass gates, appropriate source and gate voltages are applied to the PMOS transistors to assure the negative voltage is applied to the gate of the respective pass gate.

4. The apparatus of claim 3 further comprising:
    a first memory cell for selectively providing a first signal (A) and its inverse ($\overline{A}$), the first signal (A) being switchable between a negative voltage and the voltage Vcc; and
    a second memory cell for selectively providing a second signal (B) and its inverse ($\overline{B}$), the second signal (B) being switchable between a negative voltage and the voltage Vcc, and
    wherein the PMOS transistors of the decoder comprise:
        a first two PMOS transistors having sources connected to receive the second signal (B) from the second memory cell and gates each connected to the first memory cell to receive a respective one of the first signal (A) and its inverse ($\overline{A}$);
        a second two PMOS transistors having sources connected to receive the inverse of the second signal ($\overline{B}$) from the second memory cell and gates each connected to the first memory cell to receive a respective one of the first signal (A) and its inverse ($\overline{A}$); and
        PMOS pull down transistors, each having a source connected to the negative voltage and a drain connected to a drain of a respective one of the first and second two PMOS transistors, wherein the PMOS pull down transistors each have a gate connected to the first memory cell to receive a different one of the first signal (A) and its inverse ($\overline{A}$) than the respective one of the first and second two PMOS transistors to which it is connected.

5. The apparatus of claim 2 wherein the decoder comprises:

PMOS transistors, each PMOS transistor having a source to drain path coupling a negative voltage to the gate of one of the pass gates;

PMOS blocking transistors, each having a source to drain path with a first end connected to one of the PMOS transistors; and NMOS transistors coupling second ends of the source to drain paths of the PMOS blocking transistors to a positive voltage.

6. The apparatus of claim 5 further comprising:

a first memory cell for selectively providing a first signal (A) and its inverse ($\overline{A}$), the first signal (A) being switchable between a negative voltage and a positive voltage; and a second memory cell for selectively providing a second signal (B) and its inverse ($\overline{B}$) the second signal (B) being switchable between a negative voltage and a positive voltage, and wherein the PMOS transistors of the decoder comprise:

four pairs of PMOS transistors, each PMOS transistor pair having source to drain paths connected in parallel to connect the negative voltage to the gate of a respective one of the pass gates, and gates including a first gate connected to the first memory cell to receive one of the first signal (A) and its inverse ($\overline{A}$) and a second gate connected to the second memory cell to receive one of the second signal (B) and its inverse ($\overline{B}$) wherein each pair of PMOS transistors receive a different combination of the first signal (A) and its inverse ($\overline{A}$) and the second signal (B) and its inverse ($\overline{B}$), and wherein the NMOS transistors of the decoder comprise:

four pairs of NMOS transistors, each pair of NMOS transistors having source to drain paths connected in series to couple a positive voltage to the gate of a particular one of the pass gates, and gates connected to receive the same one of the first signal (A) and its inverse ($\overline{A}$) and the second signal (B) and its inverse ($\overline{B}$) as the PMOS transistor pair which is also coupled to the particular pass gate transistor.

7. The apparatus of claim 2, further comprising a negative voltage pump for providing the negative voltage, the negative voltage pump comprising:

a capacitor having a first terminal connected to receive a clock signal and a second terminal;

a first PMOS transistor having a source to drain path connecting the second terminal of the capacitor to an output supplying the negative voltage, and a gate connected to the second terminal of the capacitor; and a second PMOS transistor having a source to drain path connecting the second terminal of the capacitor to a low voltage potential.

8. The apparatus of claim 7, wherein the low voltage potential is at ground and the clock signal transitions between ground and Vcc.

9. The apparatus of claim 4, further comprising a negative voltage pump for providing the negative voltage to each of the first memory cell and the second memory cell, the negative voltage pump comprising:

a capacitor having a first terminal connected to receive a clock signal which transitions between ground and Vcc, and having a second terminal;

a first PMOS transistor having a source to drain path connecting the second terminal of the capacitor to an output supplying the negative voltage, and a gate connected to the second terminal of the capacitor; and a second PMOS transistor having a source to drain path connecting the second terminal of the capacitor to ground.

10. The apparatus of claim 6, further comprising a negative voltage pump for providing the negative voltage, the negative voltage pump comprising:

a capacitor having a first terminal connected to receive a clock signal and a second terminal;

a first PMOS transistor having a source to drain path connecting the second terminal of the capacitor to an output supplying the negative voltage, and a gate connected to the second terminal of the capacitor; and a second PMOS transistor having a source to drain path connecting the second terminal of the capacitor to a low voltage potential.

* * * * *